(12) United States Patent
Kanesaka et al.

(10) Patent No.: US 7,576,899 B2
(45) Date of Patent: Aug. 18, 2009

(54) HOLOGRAM RECORDING DEVICE AND PHASE MASK HAVING A DIFFUSING PATTERN WITH A MINIMUM UNIT IN RELATION TO A MINIMUM UNIT OF A SPATIAL MODULATOR

(75) Inventors: Tomoki Kanesaka, Miyagi (JP); Nobuhiro Kihara, Kanagawa (JP); Shigeyuki Baba, Tokyo (JP); Hisayuki Yamatsu, Tokyo (JP); Megumi Ezura, Tokyo (JP)

(73) Assignee: Sony Corporation, Tokyo (JP)

( * ) Notice: Subject to any disclaimer, the term of this patent is extended or adjusted under 35 U.S.C. 154(b) by 230 days.

(21) Appl. No.: 11/276,527

(22) Filed: Mar. 3, 2006

(65) Prior Publication Data
US 2006/0221421 A1    Oct. 5, 2006

(30) Foreign Application Priority Data
Mar. 29, 2005    (JP)    ............................ P2005-094158

(51) Int. Cl.
*G02B 5/32* (2006.01)

(52) U.S. Cl. .......................................... 359/21; 359/22

(58) Field of Classification Search ...................... 359/1, 359/21, 22, 30
See application file for complete search history.

(56) References Cited

U.S. PATENT DOCUMENTS

| 4,837,843 | A | * | 6/1989 | Owechko ..................... 382/211 |
| 5,914,802 | A | * | 6/1999 | Stappaerts et al. .......... 359/279 |
| 5,995,251 | A | * | 11/1999 | Hesselink et al. ............. 359/30 |
| 2005/0207313 | A1 | * | 9/2005 | Handschy et al. ........... 369/103 |
| 2008/0062490 | A1 | * | 3/2008 | Cheng et al. ................. 359/32 |

* cited by examiner

*Primary Examiner*—Alessandro Amari
*Assistant Examiner*—Jennifer L. Doak
(74) *Attorney, Agent, or Firm*—Oblon, Spivak, McClelland, Maier & Neustadt, P.C.

(57) ABSTRACT

A hologram recording device for recording interference fringes between reference light and signal light modulated by data displayed in a spatial modulator in a hologram recording material, the hologram recording device including a phase mask for diffusing light, the phase mask being disposed in an optical system that the signal light passes, wherein a minimum unit of a light diffusing pattern formed in the phase mask is a natural number of times a minimum unit of display data of the spatial modulator.

13 Claims, 7 Drawing Sheets

1

2

3

4

HOLOGRAM RECORDING DEVICE AND PHASE MASK HAVING A DIFFUSING PATTERN WITH A MINIMUM UNIT IN RELATION TO A MINIMUM UNIT OF A SPATIAL MODULATOR

CROSS REFERENCES TO RELATED APPLICATIONS

The present invention contains subject matter related to Japanese Patent Application JP 2005-094158 filed with the Japanese Patent Office on Mar. 29, 2005, the entire contents of which being incorporated herein by reference.

BACKGROUND OF THE INVENTION

The present invention relates to a hologram recording device for recording interference fringes between signal light and reference light on a hologram recording medium, and particularly to a phase mask for suppressing the DC component of the signal light.

A holographic data storage system has recently been proposed which records and reproduces a large volume of data using hologram technology for volume-recording interference fringes between signal light spatially modulated by information and reference light on a hologram recording material.

In a conventional holographic data storage system, coherent laser light 50 emitted from a light source (not shown) is split into signal light 100 and reference light 200, as shown in FIG. 9. When the signal light 100 thus obtained is passed through a spatial modulator (SLM) 1, the signal light 100 is spatially modulated by information (data pattern) displayed in the SLM 1. The signal light 100 spatially modulated by the SLM 1 is condensed in the vicinity of a hologram recording material 3 by a lens 2, and is made to interfere with the reference light 200 separately applied to the hologram recording material 3, whereby a hologram is recorded.

At this time, the laser light 50 entering the SLM 1 is diffracted according to the pixel pattern of the SLM 1 and the data pattern being displayed in the SLM 1. As a result, the signal light 100 has a certain spread on the hologram recording material 3. According to a theory of wave optics, this spread has a relation to the Fourier transform pattern of an image displayed in the SLM 1, and the size of the spread is proportional to the size of pixels displayed in the SLM 1 and the focal length of the lens. FIG. 10 shows an example of simulation of the spread of the signal light 100 on the hologram recording material 3.

FIG. 10 indicates that light on the hologram recording material 3 has high intensities around an origin, and has low light intensities in other parts. Incidentally, the high intensity component around the origin is referred to as a DC component. Such a non-uniform distribution is known as problem of the DC component when the SLM 1 performing only intensity modulation is used. It is known that such non-uniformity causes various problems at a time of recording holograms, and some measures against the problems have been proposed (see for example Non-Patent Document 1, Holographic Data Storage; H. J. Coufal, D. Psaltis, and G. T. Sincerbox ED; Springer; p. 259 to 269 Beam Conditioning Techniques for Holographic Recording Systems).

One of such measures is a method using an optical part referred to as a random phase mask or a diffuser. This optical part for example has a same pitch as the pixel pitch of the SLM 1 and a random pattern with phase differences of zero and π. The optical part is disposed such that the random pattern of the optical part conforms to the pixels of the SLM 1. The optical part thereby diffuses light. The optical part having a random pattern with phase differences of zero and π is referred to as a phase mask. Thus diffusing light results in a uniform distribution of light on the hologram recording material 3, thus greatly improving recording characteristics.

SUMMARY OF THE INVENTION

When the phase mask for removing the DC component from the signal light is introduced into a signal light optical system as described above in order to prevent the signal light concentrated too much on the hologram recording material from decreasing efficiency of use of the hologram recording material and decreasing an S/N, the problem caused by the DC component of the signal light is solved, whereas it is known that noise is increased instead because noise resulting from the introduction of the phase mask is superimposed on the signal light. This is caused by superimposition of an intensity component on the image of the diffuser which inherently has only a phase component due to effects of aberration of a hologram recording and reproducing optical system and incompleteness of hologram recording itself. For example, even with an ideal phase mask, the aberration of the signal light optical system tends to cause variations in intensity particularly at pattern boundary parts in the image of the phase mask (intensity variations do not occur when the image of the phase mask is ideally formed). When the intensity variations are superimposed on the data pattern of the signal light, it presents a problem in reading data, and deteriorates a bER.

The present invention has been devised in view of the above situation. It is desirable to provide a phase mask and a hologram recording device using the phase mask that can suppress the DC component of signal light without degrading the S/N of a reproduced image, and improve a bER.

According to an embodiment of the present invention, there is provided a hologram recording device for recording interference fringes between reference light and signal light modulated by data displayed in a spatial modulator in a hologram recording material, the hologram recording device including a phase mask for diffusing light, the phase mask being disposed in an optical system that the signal light passes, wherein a minimum unit of a light diffusing pattern formed in the phase mask is a natural number of times a minimum unit of display data of the spatial modulator.

Thus, in the present invention, by setting the minimum unit of the light diffusing pattern formed in the phase mask to a natural number of times the minimum unit of display data of the spatial modulator, the boundary of the light diffusing pattern of the phase mask is prevented from lying on the inside of the minimum unit of display data of the spatial modulator, and therefore the boundary part of the pattern of the phase mask does not appear inside a data block. It is thereby possible to prevent degradation in the S/N of a recording image without noise caused by the phase mask being superimposed on the signal light. This has been confirmed by experiment. It is therefore possible to suppress the DC component of signal light without degrading the S/N of a reproduced image, and improve a bER.

According to the present invention, by setting the minimum unit of the light diffusing pattern formed in the phase mask to a natural number of times the minimum unit of display data of the spatial modulator, the boundary of the light diffusing pattern of the phase mask is prevented from lying on the inside of the minimum unit of display data of the spatial modulator. It is therefore possible to suppress the DC component of signal light without degrading the S/N of a reproduced image, improve a bER, and improve recording density by effectively using the dynamic range of a hologram recording medium.

DETAILED DESCRIPTION OF THE PREFERRED EMBODIMENTS

A need to suppress the DC component of signal light without degrading the S/N of a reproduced image, and improve a bER is achieved by preventing the boundary of a light diffusing pattern of a phase mask from lying on the inside of a minimum unit of display data of a spatial modulator by setting a minimum unit of the light diffusing pattern formed in the phase mask to a natural number of times the minimum unit of display data of the spatial modulator.

Figure 1:
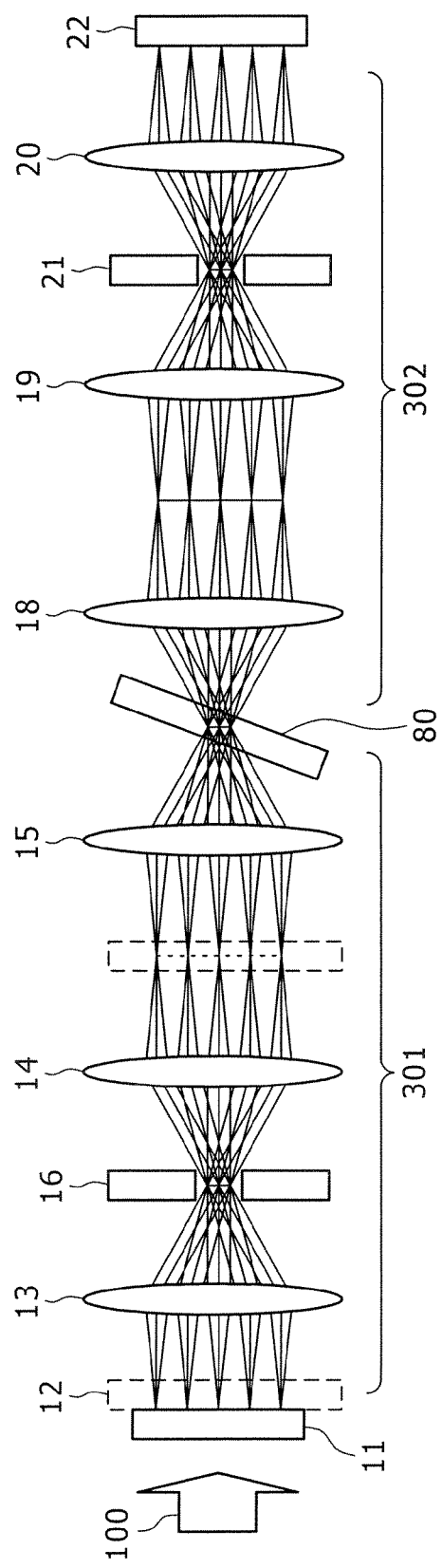
FIG. 1 is a block diagram showing a configuration of principal parts of a hologram recording device according to a first embodiment of the present invention.

FIG. 1 is a block diagram showing the configuration of principal parts of a hologram recording device according to a first embodiment of the present invention. The hologram recording device includes a signal light optical system 301 for recording and a signal light optical system 302 for reproduction. The recording signal light optical system 301 has a spatial modulator (SLM) 11, a phase mask 12 disposed at a position adjacent to the SLM 11, lenses 13, 14, and 15 forming the signal light optical system, and a high-frequency cutoff aperture 16 inserted between the lenses 13 and 14 to remove unnecessary light. A part represented by a broken line in the figure (phase mask) will be described later. The reproduction signal light optical system 302 has lenses 18, 19, and 20 forming the reproduction signal light optical system, a high-frequency cutoff aperture 21 inserted between the lenses 19 and 20 to remove unnecessary light, and an image sensor 22 for receiving reproduced signal light and thereby obtaining reproduced image data. In addition, a hologram recording material 80 is set in the hologram recording device as described above to record and reproduce holograms.

The operation of the first embodiment will next be described. Signal light 100 branched off from laser light emitted from a laser light source not shown in the figure is spatially modulated by a data page displayed in the SLM 11, further diffused by the phase mask 12, and thereafter condensed in the hologram recording material 80 through the lenses 13, 14, and 15. At this time, unnecessary light such as high-order light or the like produced when the signal light 100 passes through the SLM 11 is cut off by the aperture 16. At this time, the hologram recording material 80 is irradiated with reference light not shown in the figure which light is branched off from the laser light. Interference fringes produced by the reference light and the signal light 100 are recorded in the hologram recording material 80.

Figure 2A:
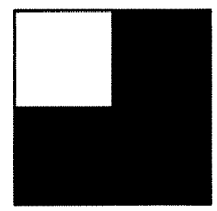
FIGS. 2A, 2B, and 2C are diagrams representing a display system of an SLM shown in FIG. 1.
Figure 2B:
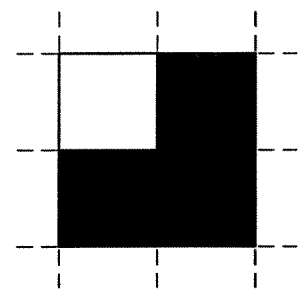
Figure 2C:
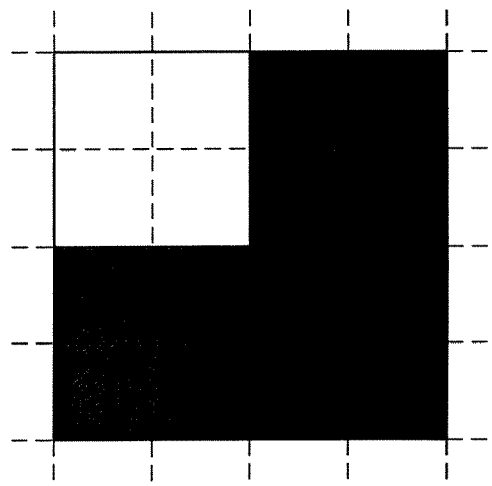

When a data page is displayed by using the SLM 11, a few pixels of the SLM 11 may be used together instead of one pixel of the SLM 11 being assigned one piece of data. For example, when data as shown in FIG. 2A is desired to be displayed, a display as shown in FIG. 2B may be made, or pixels may be displayed together as shown in FIG. 2C. However, a total number of pixels of the SLM 11 being the same, a recording capacity per page is reduced, of course, when the method of FIG. 2C is employed. Similarly, the phase mask 12 does not need to be changed in phase in the same unit as the pitch of the SLM 11, and can be changed in phase with several pixels of liquid crystal as a unit.

When the hologram recording material 80 in which a hologram is recorded as described above is irradiated with the same reference light (not shown) as that at the time of recording, diffracted light is caused by the interference fringes recorded in the hologram recording material 80. Reproduced signal light as the diffracted light is passed through the lenses 18, 19, and 20, and received by the image sensor 22. The recorded data page is thereby read by the image sensor 22. The data page is subjected to image processing, and then decoded, whereby recorded data is reproduced.

Incidentally, the high-frequency cutoff aperture 16 within the recording signal light optical system 301 in FIG. 1 cuts off high-order diffracted light occurring in the SLM 11 and the like to prevent unnecessary exposure to light of parts on the hologram recording material 80. The high-frequency cutoff aperture 21 within the reproduction signal light optical system 302 in FIG. 1 cuts off a scattered light component of light reproduced from the hologram and light reproduced from unnecessary holograms. The phase mask 12 is for example an optical part having a random pattern with the same pitch as the pixel pitch of the SLM 11 and such a phase difference as $\pi$ that makes waves cancel each other. The phase mask 12 diffuses the signal light 100 passed through the SLM 11. When the light is thus diffused, the light is distributed uniformly on the hologram recording material 80, and the DC component is cut off, so that recording characteristics such as a degree of multiplexing and the like are greatly improved. The phase mask 12 may be situated at a position (a position indicated by the broken line in FIG. 1) such that the SLM 11 and the phase mask 12 are in image-forming relation to each other.

Figure 3A:
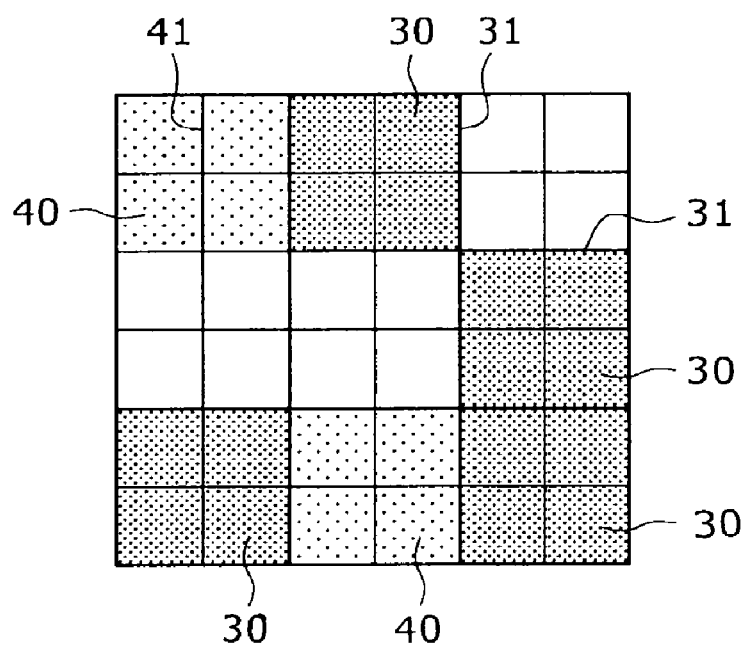
FIGS. 3A and 3B are diagrams of assistance in explaining a relation between the display data of the SLM shown in FIG. 1 and the pattern of a phase mask.
Figure 3B:
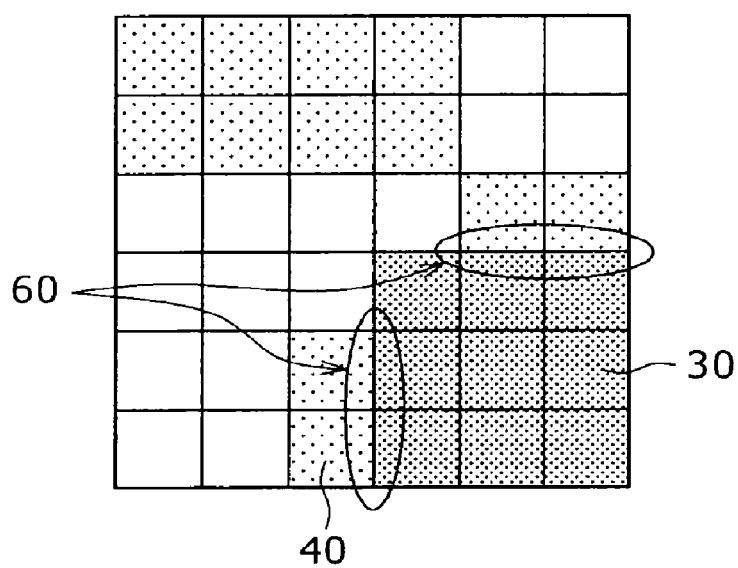

As it is, however, though the DC component of the signal light is suppressed, noise is increased as a result of using the phase mask 12. Accordingly, a unit of phase modulation in the phase mask 12 in the first embodiment is set to a natural number of times the data unit of the SLM 11. FIG. 3A shows such an example, in which figure a square 30 represents a data unit of the phase mask 12, a line 31 represents a boundary line of a phase mask pattern, a square 40 represents a data unit of the SLM 11, and a line 41 represents a pixel boundary of the SLM 11. A relation can be formed such that a boundary part of the pattern of the phase mask 12 does not come inside a data block of the SLM 11. FIG. 3B shows an undesirable example in which a boundary part of the pattern of the phase mask 12 comes inside a data block of the SLM 11, as indicated by reference numeral 60. Thus, a boundary part of the pattern of the phase mask 12 does not appear inside a data block, and therefore the superimposing of noise on the signal light 100 as a result of the insertion of the phase mask 12 is prevented. This has been confirmed by experiment.

According to the first embodiment, by setting a unit of phase modulation in the phase mask 12 to a natural number of times the data unit of the SLM 11, it is possible to prevent noise resulting from the use of the phase mask 12 from being superimposed on the signal light 100, suppress the DC component of the signal light without an increase in noise, and multiplex more high-quality images. It is to be noted that while data has a square shape in the above-described embodiment, the data shape may of course be a rectangular shape or other shapes, and similar effects can be obtained.

Figure 4A:
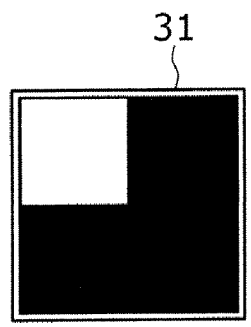
FIGS. 4A, 4B, and 4C are diagrams showing a configuration of a phase mask used in a hologram recording device according to a second embodiment of the present invention.
Figure 4B:
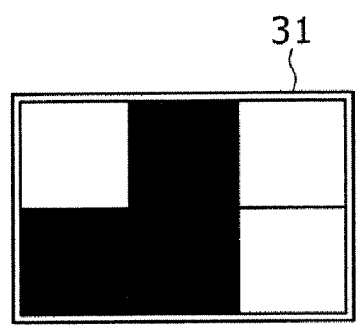
Figure 4C:
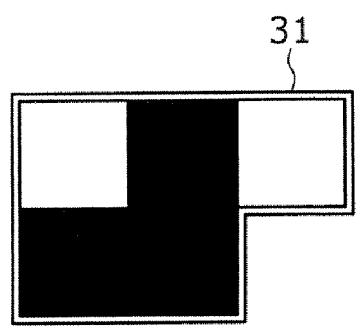
Figure 5A:
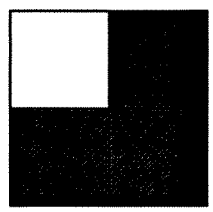
FIGS. 5A, 5B, 5C, and 5D are diagrams of assistance in explaining the data patterns of a 2-4 modulation system.
Figure 5B:
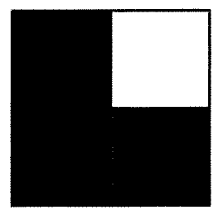
Figure 5C:
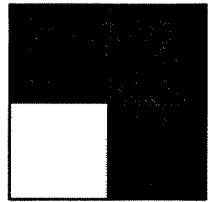
Figure 5D:
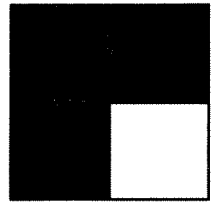

FIGS. 4A, 4B, and 4C are diagrams showing a configuration of a phase mask used in a hologram recording device according to a second embodiment of the present invention. However, since constitutions of the present example are similar to those of the above-described first embodiment, description of the constitution and operation of each part having the same constitution will be omitted, and description will be made in the following of characteristic parts of the operation.

When a pattern of data of an SLM is modulated, a phase mask according to the second embodiment has the same unit of phase modulation as the modulated block unit. When data is subjected to 2-4 modulation as shown in FIGS. 5A, 5B, 5C, and 5D by the SLM, for example, a phase mask having a unit as shown in a line 31 in FIG. 4A is used, whereby similar effects to those of the first embodiment can be automatically obtained. Incidentally, the so-called 2-4 modulation can associate two-bit data with four patterns as shown in FIG. 5A to 5D. Of course, the modulated pattern is not limited to the square shape, and similar effects can be obtained by a rectangular shape as shown in FIG. 4B or another shape as shown in FIG. 4C.

Figure 6:
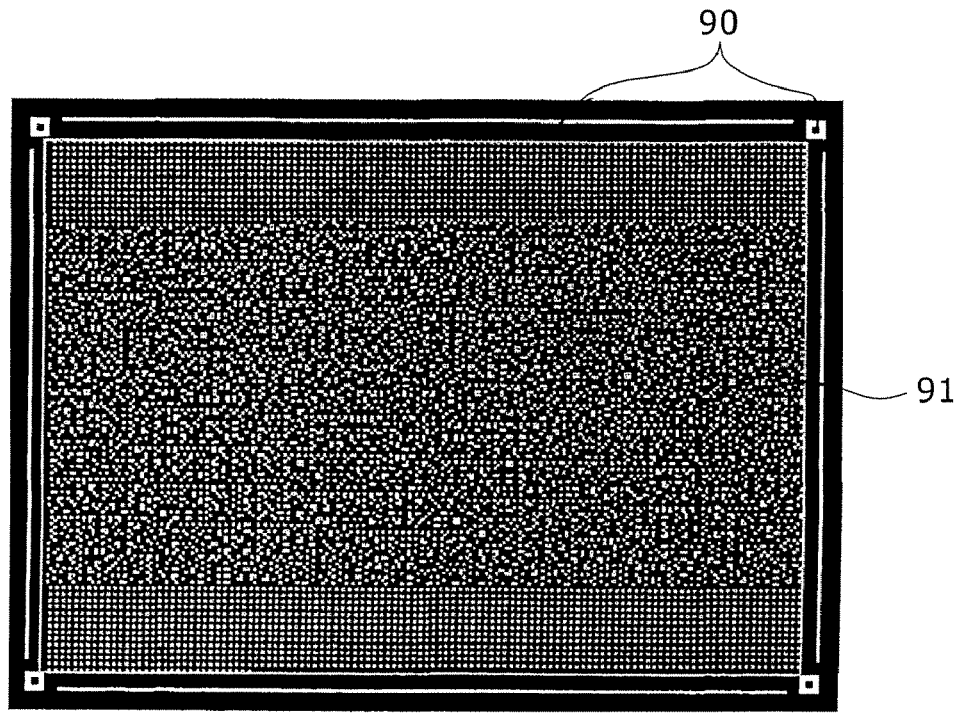
FIG. 6 is a diagram of assistance in explaining a relation between a phase mask and an SLM used in a hologram recording device according to a third embodiment of the present invention.

FIG. 6 is a diagram of assistance in explaining a relation between a phase mask and an SLM used in a hologram recording device according to a third embodiment of the present invention. However, since constitutions of the present example are similar to those of the above-described first embodiment, description of the constitution and operation of each part having the same constitution will be omitted, and description will be made in the following of characteristic parts of the operation.

Figure 7:
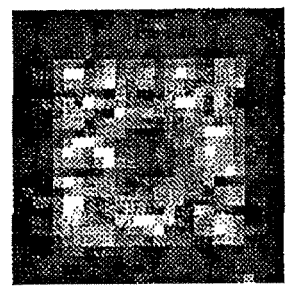
FIG. 7 is a diagram showing an example in which pattern boundaries of a phase mask appear at an alignment mark and parts other than modulated data.

A reproduced image obtained by an image sensor normally includes information for assisting in signal reproduction, such as an alignment mark 90 and the like. Image quality of the alignment mark 90 and the like is also important, and degradation in the image quality of the alignment mark 90 and the like due to effects of a pattern boundary part as a result of insertion of a phase mask must be prevented. The shape and area of the alignment mark 90 are generally different from those of a modulated data block. In a case of a phase mask created with the same pitch over the entire surface thereof, a modulated block part is not affected by a pattern boundary part, but pattern boundaries of the phase mask appear at the alignment mark 90 and parts other than modulated data as shown in FIG. 7, thus decreasing accuracy of recognition of the alignment mark.

Accordingly, a light diffusing pattern is not created in parts of the phase mask which parts correspond to other than the data area of the SLM in the third embodiment. This prevents degradation in image quality due to insertion of the phase mask in the alignment mark, and thereby prevents decrease in accuracy of recognition of the alignment mark. For example, a light diffusing pattern is created in only an area of the phase mask which area corresponds to a part 91 (corresponding to a data display area of the SLM) shown in FIG. 6, and the pattern is not created in other parts.

According to the third embodiment, by creating the light diffusing pattern of the phase mask in only the area corresponding to the data page display area 91 of the SLM, and not creating the light diffusing pattern in other areas (the alignment mark 90), decrease in the accuracy of recognition of the alignment mark is prevented. It is thereby possible to maintain accuracy of positioning used in image processing at a time of reproduction at a high level, and thus reproduce high-quality images efficiently.

Figure 8:
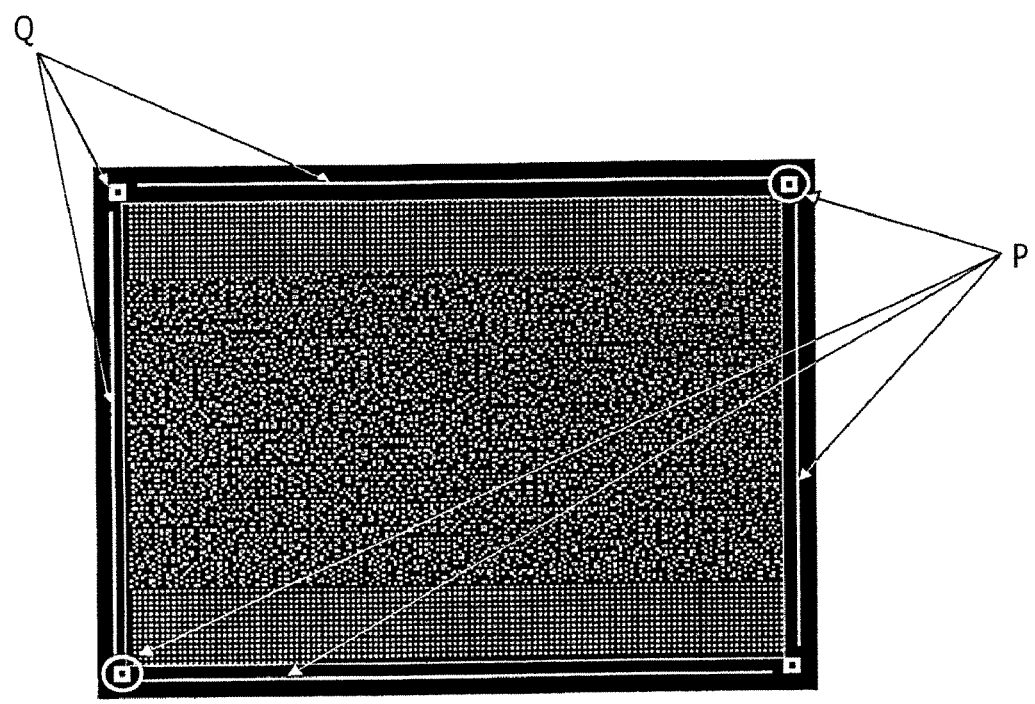
FIG. 8 is a diagram showing an example in which a pattern part of a phase mask is made different in phase by $\pi$ according to positions of an alignment mark.
Figure 9:
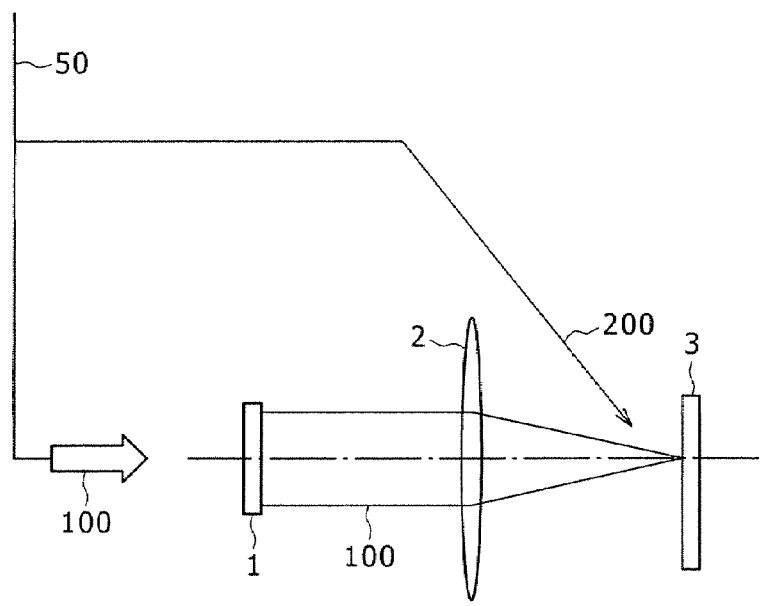
FIG. 9 is a diagram showing a configuration of principal parts of a conventional holographic data storage system.
Figure 10:
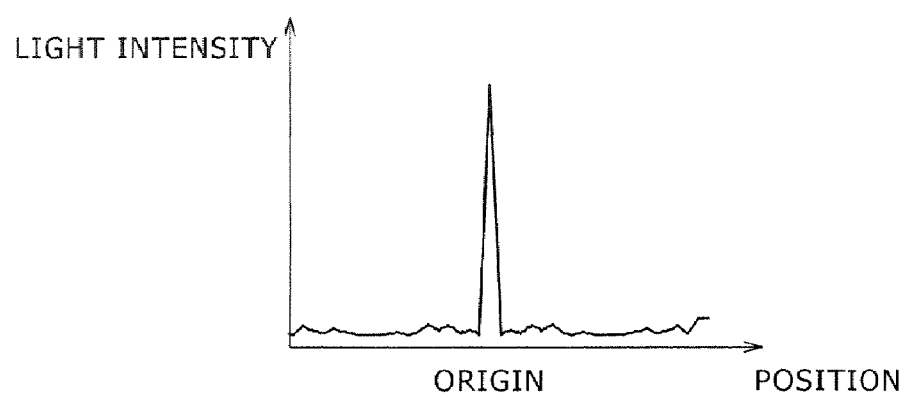
FIG. 10 is a characteristic diagram representing an example of simulation of the spread of signal light on a hologram recording material.

As for a modification of the above embodiment, absence of the pattern in the alignment mark display area of the SLM is equivalent to absence of the phase mask when viewing only that area. Therefore the DC component of signal light resulting from the alignment mark display area remains, thus causing a degradation in image quality. A phase difference is provided to data parts of the alignment mark 90 and the like, which parts are generally plural, with these parts as a unit, so as to effect cancellation as a whole. For example, as shown in FIG. 8, a pattern part of the phase mask which part corresponds to parts indicated by P is made to be in the same form as a data page marker, and the phase as a whole of the pattern is advanced by $\pi$. A pattern part of the phase mask which part corresponds to parts indicated by Q is made to have a phase difference of zero, that is, no pattern is created in the pattern part. Further, the same normal pattern as in the first embodiment is created in an area indicated by R (corresponding to the data display area of the SLM). Thereby similar effects to those of the above-described second embodiment can be obtained.

It is to be noted that the present invention is not limited to the foregoing embodiments, and that the present invention is susceptible of embodiment in various other forms in terms of specific constitutions, functions, action, and effects without departing from the spirit of the invention. For example, the effect of DC component reduction can be increased by making the phase mask in all of the foregoing embodiments have a phase distribution such that a sum of complex amplitude of transmitted light is zero or may be regarded as substantially zero. In addition, since the present invention is concerned with a signal light optical system, the present invention is of course effective similarly for a so-called in-line type (or collinear type) recording and reproducing system in which signal light and reference light coaxially pass through the same optical path.

It should be understood by those skilled in the art that various modifications, combinations, sub-combinations and alterations may occur depending on design requirements and other factors insofar as they are within the scope of the appended claims or the equivalents thereof.

What is claimed is:

1. A hologram recording device for recording interference fringes between reference light and signal light modulated by data displayed in a spatial modulator in a hologram recording material, said hologram recording device comprising:
   the spatial modulator comprised of a plurality of pixels, which is configured to display a minimum unit of display data over multiple pixels of the spatial modulator, the minimum unit of display data being a size less than a total number of pixels in the spatial modulator;

a phase mask for diffusing light and comprised of a plurality of pixels, said phase mask being disposed in an optical system that said signal light passes through, wherein a minimum unit of a light diffusing pattern formed in said phase mask is a size that is a natural number of times the size of the minimum unit of display data of said spatial modulator, and the light diffusing pattern is a distribution of one or more portions of the phase mask which perform phase modulation on the signal light passed through the signal modulator, the minimum unit of the light diffusing pattern being a size that is less than a total number of pixels used in the light diffusing pattern.

2. The hologram recording device as claimed in claim 1, wherein a data part of said signal light is modulated by a block code through said spatial modulator, and a boundary of said pattern of said phase mask does not lie on an inside of a block of said block code.

3. The hologram recording device as claimed in claim 1, wherein a boundary of said light diffusing pattern of said phase mask does not lie on a display area of an alignment mark for image processing in said spatial modulator.

4. The hologram recording device as claimed in claim 1, wherein said light diffusing pattern is formed in only an area corresponding to a data display area of said spatial modulator in an area of said phase mask.

5. The hologram recording device as claimed in claim 4, wherein said light diffusing pattern is not formed in an area corresponding to a display area of an alignment mark for image processing in said spatial modulator in an area of said phase mask.

6. The hologram recording device as claimed in claim 1, wherein said pattern of said phase mask has a phase distribution such that a sum of complex amplitude of transmitted light is zero or can be regarded as substantially zero.

7. A phase mask comprising a plurality of pixels for diffusing light modulated by a spatial modulator which comprises a plurality of pixels, wherein a size of a minimum unit of a light diffusing pattern formed in said phase mask is a natural number of times a size of a minimum unit of display data of said spatial modulator and is a size that is less than a total number of pixels used in the light diffusing pattern, the minimum unit of display data is displayed over multiple pixels of the spatial modulator and is a size less than a total number of pixels in the spatial modulator, and the light diffusing pattern is a distribution of one or more portions of the phase mask which perform phase modulation on light passed through the signal modulator.

8. A hologram recording method comprising the steps of:

modulating signal light by a spatial modulator which comprises a plurality of pixels;

displaying a minimum unit of display data over multiple pixels of the spatial modulator, the minimum unit of display data being a size less than a total number of pixels in the spatial modulator;

diffusing the modulated signal light by a phase mask comprising a plurality of pixels in which a size of a minimum unit of a light diffusing pattern is a natural number of times the size of the minimum unit of display data of said spatial modulator, and the light diffusing pattern is a distribution of one or more portions of the phase mask which perform phase modulation on the signal light passed through the signal modulator, the minimum unit of the light diffusing pattern being a size that is less than a total number of pixels used in the light diffusing pattern;

condensing the diffused signal light by a lens; and recording interference fringes between the condensed signal light and reference light in a hologram recording material.

9. The hologram recording method as claimed in claim 8, wherein a boundary of said light diffusing pattern of said phase mask does not lie on a display area of an alignment mark for image processing in said spatial modulator.

10. The hologram recording method as claimed in claim 8, wherein said light diffusing pattern is formed in only an area corresponding to a data display area of said spatial modulator in an area of said phase mask.

11. The hologram recording method as claimed in claim 10, wherein said light diffusing pattern is not formed in an area corresponding to a display area of an alignment mark for image processing in said spatial modulator in an area of said phase mask.

12. The hologram recording method as claimed in claim 8, wherein said pattern of said phase mask has a phase distribution such that a sum of complex amplitude of transmitted light is zero or can be regarded as substantially zero.

13. The hologram recording device as claimed in claim 1, wherein the natural number is greater than 1.

* * * * *